United States Patent
Fleischer

[11] 3,946,210
[45] Mar. 23, 1976

[54] RESETTABLE ELECTRONIC COUNTER EMPLOYING A CALCULATOR CHIP

[75] Inventor: Donald Whiting Fleischer, Wethersfield, Conn.

[73] Assignee: Veeder Industries, Inc., Hartford, Conn.

[22] Filed: Mar. 21, 1975

[21] Appl. No.: 560,599

[52] U.S. Cl. .... 235/92 SA; 235/92 CC; 235/92 DE; 235/92 R; 328/48
[51] Int. Cl.² ......................................... H03K 21/32
[58] Field of Search ...... 235/92 CC, 92 DE, 92 EA, 235/92 LG, 92 SA; 307/220 R; 328/48

[56] References Cited
UNITED STATES PATENTS

| | | | |
|---|---|---|---|
| 3,704,361 | 11/1972 | Patterson | 235/92 LG |
| 3,806,709 | 4/1974 | Fitch et al. | 235/92 CC |

*Primary Examiner*—Joseph M. Thesz, Jr.
*Attorney, Agent, or Firm*—Prutzman, Hayes, Kalb & Chilton

[57] ABSTRACT

A resettable electronic counter employing an integrated solid state calculator circuit element, or chip, includes counter reset circuitry for automatically resetting the counter. The calculator circuit provides timing signals and is responsive to timing signals selectively connected to an arithmetic and control section thereof for clearing a count stored in registers thereof and display means external thereto, for storing a selected count in the registers, and for cumulatively adding indexing signals to the stored count. The counter reset circuitry includes control logic and a sequence counter actuated by a reset signal to generate a series of step signals. The step signals and certain timing signals are connected to the control logic which is in turn connected to the arithmetic and control section of the calculator circuit. The reset circuitry is operable to apply, to the arithmetic and control section, in predetermined sequence, those timing signals for clearing and for storing a count, and additionally to control the application of count indexing signals.

12 Claims, 1 Drawing Figure

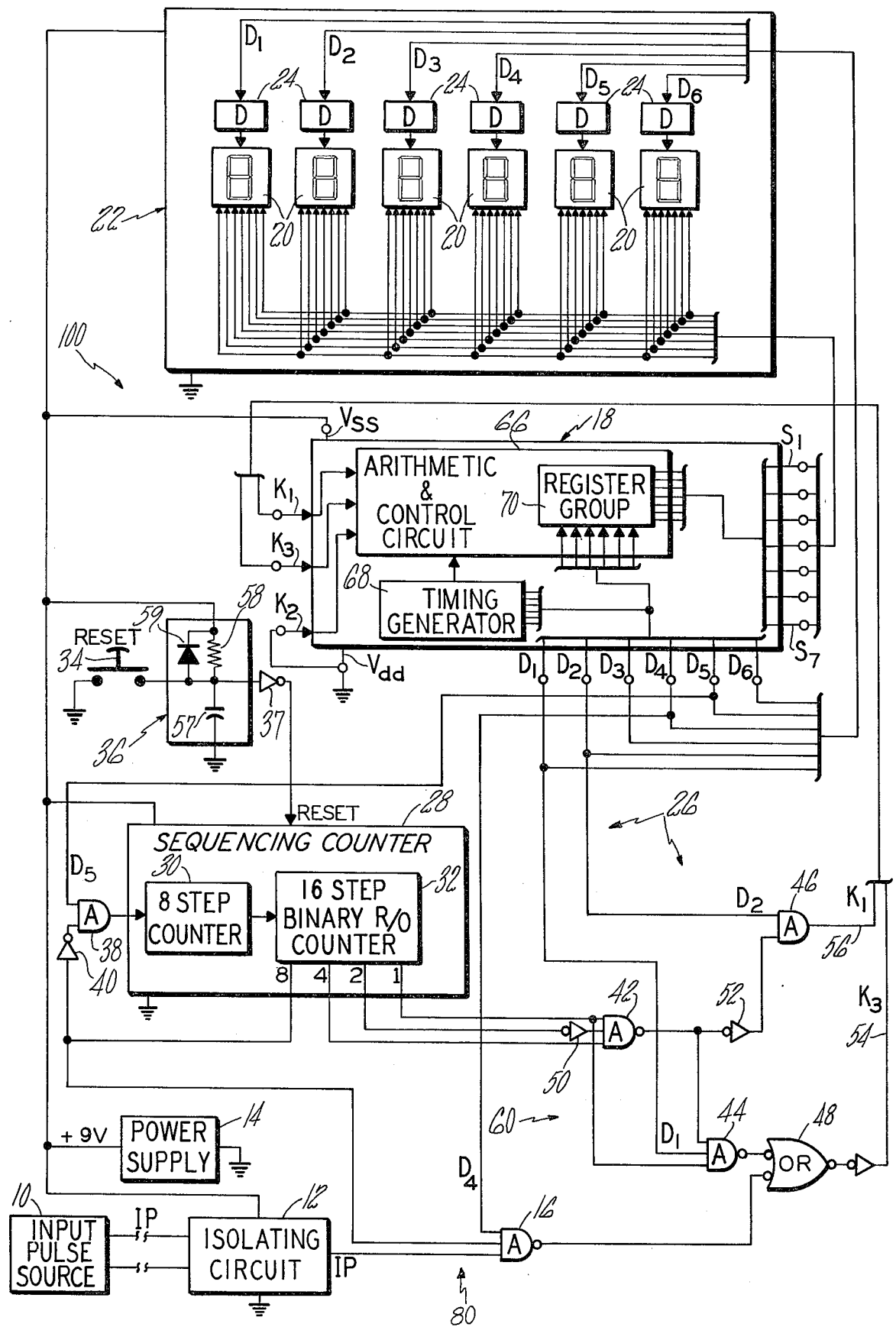

RESETTABLE ELECTRONIC COUNTER EMPLOYING A CALCULATOR CHIP

BRIEF SUMMARY OF THE INVENTION

The invention relates to electronic counters and more particularly to resettable electronic counters.

It is a primary object of the invention to provide a low cost electronic counter.

It is another object of the invention to provide an improved electronic counter of reduced cost and size relative to a comparable electromechanical counter.

It is a further object to provide an improved counter according to the invention which exhibits longer life and greater accuracy than a comparable electromechanical counter.

It is an even further object to provide an improved counter according to the invention which is easily reset.

It is still another object of the invention to provide an improved counter according to the invention which employs LSI circuitry.

It is a still further object to provide an improved counter according to the invention which includes reset sequencing circuitry for automatically clearing a previous count and conditioning the counter for counting in preselected steps or increments.

Other objects will be in part obvious and in part pointed out more in detail hereinafter.

A better understanding of the invention will be obtained from the following detailed description and the accompanying drawing of an illustrative application of the invention.

BRIEF DESCRIPTION OF THE DRAWING

In the drawing:

The FIGURE is a functional diagram or schematic of the counter of the invention including conventional logic elements.

DESCRIPTION OF THE PREFERRED EMBODIMENT

Referring now to the drawing in detail wherein like numerals and/or letters are used to designate like parts or logic signals, the FIGURE shows a counter 100 according to the invention which receives electrical count input or indexing signals from some pulse source 10. Pulse source 10 typically provides count pulses caused by contact closures, photoelectric beam interruptions or the like, as indications of events or quantities to be counted. The indexing signal pulses IP from source 10 are connected with and applied to the counter 100 through an input circuit, generally designated 80, which includes an isolating circuit 12 typically including light emitting and light responsive circuit elements, for electrically isolating the pulse source circuitry 10 from the counter while serving to couple the input pulses thereto. A DC power supply 14, such as a small battery, provides a positive DC potential of 9 volts and is connected to the isolating circuit 12. Isolating circuit 12 outputs a positive signal symbolic of the logic 1 state, and also designated IP, each time an input pulse is generated by pulse source 10. The output of isolating circuit 12 is connected as one of the inputs to AND gate 16 for controlling introduction of count-indexing signals to an electronic calculator circuit 18 following conditioning of the circuit 18 to begin a counting operation. Calculator circuit 18 forms a core counter circuit for incrementally counting input signal pulses IP.

Calculator circuit 18, shown here in block diagram form in the interest of brevity, is in the form of a single LSI solid state element, commonly referred to as a "chip," of the type commonly used in electronic calculators. Circuit 18, hereinafter referred to as "chip 18," uses state of the art LSI technology employing PMOS, CMOS or the like. In the embodiment being described, chip 18 comprises a PMOS/LSI 6 digit calculator circuit (MM5736) by National Semiconductor Corporation.

Chip circuit 18 includes an arithmetic and control circuit section 66 (hereinafter A and C section) and an internal clock 68. A and C circuit 66 receives data signals for entry via the conductor circuits of chip input terminals $K_1$, $K_2$ and $K_3$. A and C section 66 includes, in addition to control logic, several (in this instance three) registers, generally designated as register group 70. Registers 70 serve a count storage function for counts entered directly and for those resulting from an arithmetic operation of previously entered counts, both capable of concurrent storage in separate registers.

Clock or timing generator 68 provides the synchronizing signals required to enter, process and display a count. Clock 68 repetitively generates a sequence of six binary signals in the logic 1 state. Each of these timing or digit signals appears respectively at a corresponding one of the terminals $D_1$, $D_2$, $D_3$, $D_4$, $D_5$ and $D_6$ on chip 18. Similarly, these timing signals, which will be referred to by the terminals $D_{1-6}$ at which they appear, always are internally connected to the registers 70 of A and C section 66. The word $D_1$ to $D_6$) cycle frequency is about 1–2 KHz, corresponding with a word time or period of about ½ – 1 millisecond. Each digit or timing signal $D_{1-6}$ has a period of slightly less than one-sixth of the full word period.

At least one of the registers of register group 70 of chip 18 is connected to seven output connectors or terminals $S_1$, $S_2$, $S_3$, $S_4$, $S_5$, $S_6$ and $S_7$ for outputting, to a display panel or register 22, binary coded signals indicative of the number or digit counts of a count stored in the registers 70. The data signals $S_{1-7}$, designated in accordance with the terminals at which they appear, are all connected to corresponding binary inputs of each of six digit display devices 20 which comprise the readout display of regiser 22. Each display device 20 comprises an LED seven segment display, each of the seven LED segments being connected to a corresponding terminal $S_{1-7}$ of chip 18. Accordingly, in this embodiment, the binary coded signals $S_{1-7}$ collectively comprise a seven segment coded decimal representation.

Entry and display at register 22 of each particular digit of a count stored in a register of group 70 is affected by sequentially providing groups of segment signals $S_{1-7}$, each group corresponding with a particular digit of the count stored in the register and being coded to energize the appropriate segments of a particular display device 20. Each particular display device 20 is sequentially enabled to receive and display the appropriate group of segment signals $S_{1-7}$ by means of a different one of the timing signals $D_{1-6}$ respectively connected thereto through driver circuits 24. Each group of segment signals $S_{1-7}$ which corresponds with a particular digit is in synchronism with one of the timing signals $D_{1-6}$. In this manner, the segment signals $S_{1-7}$ corresponding with a particular digit of a stored count will be outputted from chip 18 and entered into the appropriately positioned display device 20 through the control timing of a particular corresponding one of the timing signals $D_{1-6}$.

Referring more specifically to the arithmetic and control section 66 of chip 18, selective application of timing signals $D_{1-6}$ to the data entry terminals $K_1$ and $K_2$ thereof is effective to store a selected count in the registers 70 and to display it on display register 22. Further, such selective application of signals $D_{1-6}$ to terminal $K_3$ is effective to enter mathematical operation instruction signals to A and C section 66. The particular chip used in the preferred embodiment is capable of entering any digit from 0–9 by selective connection of a timing signal $D_{1-6}$ to one of the terminals $K_1$ or $K_2$. The operation instructions, which include add, subtract, multiply, divide and clear, are entered via a terminal $K_3$. The digit 1 is entered by applying timing signal $D_2$ to terminal $K_1$. Because the counter 100 is intended, in this instance, to count in steps or increments of one, the 1 digit is the only digit requiring entry and the $K_2$ input is accordingly blocked by connection to ground. It will be appreciated, however, that an input pulse IP to counter 100 might be indicative of some quantity other than 1 and that such pulse, through association with the appropriate one of digit signals $D_{1-6}$ and with chip input $K_1$ or $K_2$, may advance the count by that of the quantity. Power terminals $Vss$ and $Vdd$ of chip 18 are respectively connected to the positive DC potential of power supply 14 and to ground.

The A and C section 66 converts a count input into BCD form and processes the count in the BCD form. A count to be displayed is transcoded from BCD form to the requisite binary seven segment coded decimal form. For use as a counter and particularly in the preferred embodiment thereof, only the "add" instruction of the four aforementioned basic arithmetic operators is employed. The "clear" instruction is also required. The "add" instruction is entered by applying timing signal $D_4$ to terminal $K_3$. The "clear" instruction is entered by applying timing signal $D_1$ to terminal $K_3$. In fact, to enter any digit or instruction into chip 18, the appropriate timing signal must be repeated for eight consecutive word cycles, this being required to avoid errors which might be introduced by contact noise, as during keying or switch actuation. Accordingly, when it is said that the occurrence of a timing signal at an input to the chip is effective to enter some number or instruction, it is implied that the required eight occurrences of that timing signal do occur. Also, the inputs ($K_1$ and $K_3$) to chip 18 must be "open" with no input signal present between each successive digit or instruction to be entered. This permits recognition of successive digits and is obtained by maintaining the "open" status for at least eight word periods.

Generally speaking, a number consisting of one or more digits (up to six) may be entered into a register of group 70, with that number being displayed on display register 22. To add two numbers, it is generally necessary to enter the first number; enter the "add" instruction; enter the second number; and again enter the "add" instruction to effect the arithmetic addition, the sum being displayed on display register 22. However, in the particular chip 18 used in the embodiment described herein, if the successive counts or numbers to be added are all the same, as is the case, it is only necessary to enter the selected number or count radix one time and an auto summing capability of the chip serves to arithmetically add the count radix to any previous sum, stored in registers 70, and to display the new count sum upon the second and each successive time the "add" instruction is entered, so long as no other number or instruction is entered therebetween. The initial entry of the "add" function serves to condition the registers 70 to receive the next number or count entry and, in the arrangement of the invention, will also redisplay the count radix following its removal from display by a single intermediate "clear" instruction.

In order to clear a number from display register 22 and the associated storage register in the A and C section 66 of chip 18, a "clear" function instruction must be entered through input terminal $K_3$. If the entry of the "clear" instruction comes immediately after entry of another instruction, as opposed to a number, it will clear all registers in the C and A section 66. However, if the "clear" instruction is entered immediately after entry of a number, it clears only that register of group 70 which contains and displays that number immediately previously entered, and does not clear the other register or registers of group 70. The registers of group 70 which are not cleared by the single "clear" instruction contain either that number immediately previously entered, if it was the first number entered following clearance of all registers, or else an earlier entered number. In this latter situation, it then is necessary to provide two consecutive entries of the "clear" instruction in order to clear all registers.

Referring now to the reset sequence circuitry of counter 100, generally designated 26, a reset sequencing binary counter 28 is operative, with associated control logic, generally designated 60, to clear all of the registers 70 of chip 18 to an "empty," or zeroed, state and to subsequently enter a selected number, in this instance a "one," into the chip to establish the integer by which the count is advanced with receipt of each input counting pulse. In this manner, counter 28 automatically establishes and controls several data entry modes during the reset mode. To facilitate an understanding of counter 28, it is depicted and described as a compound counter comprising a first, lower order, divide-by-8, or 8 step, counter 30, and a second, higher order, divide-by-16, or 16 step, counter 32 connected serially to the output of counter 30 and having a four conductor binary output. In fact, counter 28 is preferably a seven stage electronic counter having outputs from each of the last four stages (i.e. counter 32) and employing MOS integrated circuitry. The first three stages of counter 28 (i.e., counter 30) are needed to permit each particular selected digit signal to appear eight successive times at an input in order to be entered in chip 18, as earlier noted.

Counters 30 and 32 of counter 28 are set to an initial zeroed condition by application thereto of a reset signal, or pulse, R. Pulse R is selectively provided by closing a normally open push button switch 34 having one contact connected to ground and the other contact connected to counter 30 through reset pulse circuit 36. Circuit 36 and logic negation element 37 are operative to apply the R signal in the logic 1 or positive potential state to the several stages of counters 30 and 32 when and while the push button switch 34 is closed and to remove the R signal when the push button is released. Application of the R signal to counters 30 and 32 results in all of their stages being set (or reset) to a zero count condition.

More specifically, reset pulse circuit 36 includes capacitor 57 connected to ground at one side and through resistor 58 to power supply 14 at the other side. The ungrounded contact of push button switch 34 is connected to the junction of resistor 58 and capacitor 57 as is the input to negation element 37. This arrangement is operative to filter any noise which output is inverted by logic negation element 50 prior to its connection as an input to the NAND gate.

Table I appearing hereinafter correlates the several counter resetting operations to be discussed with the various outputs or steps of the ÷ 16 reset counter 32.

TABLE I

| STEP (of ÷ 16 Counter 32) | BINARY STATE OF EACH OUTPUT OF COUNTER 32 | | | | RESET SEQUENCE OPERATIONS |
|---|---|---|---|---|---|
| | 8 | 4 | 2 | 1 | |
| 0 | 0 | 0 | 0 | 0 | Reset Counters 30 and 32 and Open Input to Counter 30 |
| 1 | 0 | 0 | 0 | 1 | Clear (Display Register) ($D_1$–$K_3$) |
| 2 | 0 | 0 | 1 | 0 | Open |
| 3 | 0 | 0 | 1 | 1 | Clear (All Registers) ($D_1$–$K_3$) |
| 4 | 0 | 1 | 0 | 0 | Open |
| 5 | 0 | 1 | 0 | 1 | Enter 1 ($D_2$–$K_1$) |
| 6 | 0 | 1 | 1 | 0 | Open |
| 7 | 0 | 1 | 1 | 1 | Clear (Display Register) ($D_1$–$K_3$) |
| 8 | 1 | 0 | 0 | 0 | Close Input to Counter 30 | might be picked up on the ungrounded contact of push button switch 34 and which otherwise might generate false reset signals. Also, it retards the rate of voltage rise at the input to negation device 37 when power is turned on, thereby providing a transitory reset pulse R which automatically disappears shortly after power is applied. Diode 59 is connected in parallel with resistor 58 to rapidly discharge capacitor 57 during any brief power losses, thereby ensuring the transitory reset pulse described in the previous sentence.

The input stepping pulses to counter 30 of sequencing counter 28 are provided by timing signal $D_5$ from chip 18. Signal $D_5$ is connected to one input of a two-input AND gate 38. The output conductor from the last stage of counter 32 having the binary encoded value of 8 is connected to the other input of AND gate 38 through a logic negation element 40. When the counters 30 and 32 are set to a logic 0 level by reset pulse R, negation element 40 is operative to apply a logic 1 at that input to AND gate 38, thereby enabling each $D_5$ pulse in the logic 1 state to be passed by the AND gate, the output of which is connected to the input of counter 30. Each $D_5$ signal passed by AND gate 38 steps counter 30. The output or final stage of ÷ 8 counter 30 is connected to the input or first stage of ÷ 16 counter 32. Following receipt of eight $D_5$ signals by counter 30, that counter is effective to provide a stepping signal or pulse to the input of counter 32. Similarly, for each eight $D_5$ signals thereafter, counter 32 is stepped an additional step. Further reference to the steps of counter 32 will inherently infer the presence of eight times as many steps of counter 30. The stepping of counter 32 continues until its eighth step at which point its output having the binary encoded value of 8 changes from the logic 0 to the logic 1 state. This attainment of the logic 1 state is effective, through logic negation element 40, to prevent further transmission of $D_5$ signals through AND gate 38 to counter 30 and thus represents completion of the reset sequence for counter 100.

In addition to AND gate 16, the reset sequence control logic includes NAND gate 42, AND gate 44, AND gate 46 and OR gate 48. NAND gate 42 receives, at its three inputs, the binary encoded outputs 1, 2 and 4 of counter 32. Outputs 1 and 4 are applied to NAND gate 42 in the normal state, whereas the binary encoded 2

From Table I, it is readily determined that the output of NAND gate 42 will be logic 1 for steps 1–4 and 6–8 of counter 32 and a logic 0 only for step 5. The output of NAND gate 42 is connected as one of the three inputs to AND gate 44. The binary encoded 1 output of counter 32 is connected as another of the inputs of AND gate 44 and the $D_1$ digit signal is connected as the remaining input to the AND gate. Signal $D_1$, as a logic 1, is passed to the output of AND gate 44 during each odd numbered step of counter 32 except step 4, or in other words, it appears as an output during steps 1, 3 and 7 of the counter.

The output of AND gate 44 is connected as an input to OR gate 48. Accordingly, each $D_1$ signal passed by AND gate 44 is also passed by OR gate 48 and appears at its output for connection via conductor 54 to input $K_3$ of chip 18. In this manner, a logic 1 signal corresponding in time with signal $D_1$ is applied to the $K_3$ input of chip 18 during steps 1, 3 and 7 of counter 32. As hereinbefore discussed, a $D_1$ signal applied to the $K_3$ input of chip 18 is effective in the first instance to clear either some or all of the registers 70 of the chip 18 and to remove the display from register 22, and in the immediately succeeding instance to clear any remaining registers not initially cleared.

The output of NAND gate 42 is additionally inverted by logic negation element 52 and then applied as one of the two inputs to AND gate 46. The other input to AND gate 46 is provided by the $D_2$ digit signal connected thereto from chip 18. The inverted output of NAND gate 42 will exist as a logic 1 only during the fifth step of ÷ 16 counter 32 and accordingly, $D_2$ as a logic 1 is passed by AND gate 46 to its output only during that fifth step of the counter 32. Conductor 56 is connected from the output of AND gate 46 to the $K_1$ input of chip 18 for applying the $D_2$ signal to the $K_1$ input during the fifth step of counter 32. As earlier discussed, a $D_2$ signal applied to the $K_1$ input is effective to enter the selected count digit one (1) in the registers of chip 18 and to display the 1 on display panel 22.

The "clear" operation resulting from the $D_1$ signal on the $K_3$ input during the seventh step of counter 32 is effective to clear that register of A and C section 66 which provides the output display, thereby removing display of the digit 1 from register 22; however, as earlier mentioned, it does not entirely clear the digit from storage in chip 18, but allows it to remain in storage in another of the registers 70 of the A and C section preparatory to the subsequent auto summing of the digit in response to the input pulses to be counted. It will be noted that steps 2, 4 and 6 (as well as 0 and 8) provide the requisite "open" status at inputs $K_1$ and $K_3$ between each digit or function input.

The input pulses IP from isolating circuit 12 are connected to one of the three inputs of AND gate 16. The binary encoded 8 output of ÷ 16 counter 32 is connected to another input of AND gate 16 and the $D_4$ timing signal is applied to the remaining input. The output from counter 32 serves to maintain gate 16 closed during the reset sequencing of counter 28, thereby preventing passage of a $D_4$ signal even though an input pulse IP may be present. However, upon completion of the reset sequencing of counter 28 (at the eighth step of counter 32), gate 16 is conditioned to pass a $D_4$ signal each time a count indexing input pulse exists concurrently therewith. The input pulses IP are scaled to be at least eight word periods in duration in order to permit the requisite eight successive $D_4$ timing signals to input to chip 18 in order to effectively input a digit, or in this instance, a mathematical operation instruction. The $D_4$ signal passed by AND gate 16 is connected from the output thereof to the input of OR gate 48. The output of OR gate 48 is connected via conductor 54 to the $K_3$ input of chip 18. The application of the $D_4$ timing signal to the $K_3$ input serves to input the "add" or "+" instruction to chip 18. As previously indicated, the selected radix count, "one," was entered in chip 18 during the fifth step of counter 32 and was retained during the seventh step. An "add" instruction occurring immediately thereafter serves to display the initially entered "one" on display register 22. Because of the auto summing capability of chip 18, each consecutively succeeding "add" instruction input serves to advance the count displayed on register 22 by one. Thus, each succeeding input pulse IP inputs an "add" instruction to chip 18, thereby advancing the count in unit increments. This continues until such time as counter 100 is reset by temporarily closing switch 34 to activate reset counter 28, as previously described.

Recapitulating, actuation of switch 34 results in the application of a reset signal R to counters 30 and 32 of sequencing counter 28 to set them to an initially zeroed condition. Upon removal of the R signal, counter 30 begins stepping in response to $D_5$ timing signals and steps counter 32 one step for each eight $D_5$ signals received.

That output of counter 32 having the binary encoded value of "8" operates to block further operation of sequencing counter 28 after eight steps of the counter 32. The outputs of counter 32 which have the binary encoded values of 1, 2 and 4 operate through NAND gate 42 and AND gates 44 and 46 to gate a $D_1$-$K_3$ "clear" signal to chip 18 during steps 1, 3 and 7 of counter 32 and a $D_2$-$K_1$ "one" signal to the chip during step 5 of the counter. No input is made to chip 18 during the resetting of counter 28 to the zeroed condition and during steps 2, 4 and 6 of counter 32 thereafter. When counter 32 reaches step 8, AND gate 16 is conditioned to apply a $D_4$-$K_3$ "add" pulse to chip 18 each time a count input pulse appears at the input to gate 16, thereby advancing the count displayed on display panel 22 in increments of "one."

As will be apparent to persons skilled in the art, various modifications, adaptations and variations of the foregoing specific disclosure can be made without departing from the teachings of the present invention.

I claim:

1. In an electronic counter having an input circuit for receiving a train of electrical indexing signals for indexing the counter to accumulate a count therein; a display register with a plurality of digit indicators of ascending order of significance for displaying a count, control input means for sequentially activating the digit indicators for sequentially entering digit counts therein respectively, and a binary input for receiving binary coded input signals for entering digit counts into the digit indicators respectively; and an integrated solid state calculator circuit element comprising an arithmetic and control circuit with register means for storing a plurality of separate multiple digit counts therein, including a selected count entered into the register means and an arithmetic count resulting from an arithmetic operation of the arithmetic and control circuit, and a binary output connected to the binary input of the display register and operable, to sequentially provide binary coded output signals indicative of the digit counts of a count stored in the register means for sequentially entering the digit counts into corresponding digit indicators of the display register respectively, for displaying the count with the display register, synchronizing circuit means for repetitively generating a sequence of timing signals, the synchronizing circuit means being connected to the arithmetic and control circuit and to the control input means of the display register for synchronously entering a count stored in the register means into the display register for display thereby, the arithmetic and control circuit having data entry circuit means and operable by selectively applying timing signals to the data entry circuit means for storing a selected count in the register means and displaying the selected count with the display register, the arithmetic and control circuit being further operable by selectively applying timing signals to the data entry circuit means for entering mathematical operation instruction signals into the arithmetic and control circuit for respectively effecting predetermined mathematical operations between the separate counts stored in the register means and storing in the register means the results of the selected mathematical operation as a new arithmetic count and displaying the new arithmetic count with the display register, and including entering an addition instruction signal for adding the selected count stored in the register means to any arithmetic count stored in the register means and storing, in the register means, the summation thereof as a new arithmetic count and displaying the new arithmetic count with the display register, the arithmetic and control circuit being further operable by selectively applying timing signals to the data entry circuit means for clearing any arithmetic count and any selected count stored in the register means; the improvement wherein the electronic counter comprises counter reset means having reset switch means operable for generating a reset signal and sequencing circuit means connected to the reset switch means and to the synchronizing circuit means and data entry circuit means and operable by a reset signal generated by the reset switch means to be automatically cycled through a reset sequence for sequentially and selectively applying timing signals to the data entry circuit means for sequentially operating the arithmetic and control circuit to clear any selected and arithmetic counts from the register means and clear the display register and to store a predetermined selected count in the register means; and wherein the counter input circuit comprises an input for receiving the train of electrical indexing signals and is operable by each indexing signal to selectively apply a timing signal to the data entry circuit means to enter an addition instruction signal to add to any arithmetic count stored in the register means the predetermined selected count stored in the register means during the reset sequence and store the summation thereof as a new arithmetic count in the register means and display the new arithmetic count with the display register.

2. The electronic counter of claim 1 wherein the arithmetic and control circuit is further operable by selective application of timing signals to the data entry circuit means for selectively clearing the display register without clearing the selected count stored in the register means, said predetermined selected count is displayed with the display register when stored, and said sequencing circuit means selectively apply timing signals to said data entry circuit means during said reset sequence following storage of said predetermined selected count to clear the display register without clearing the selected count from the register means.

3. The electronic counter of claim 1 wherein said sequencing circuit means comprise a multiple step electronic sequence counter having a drive input selectively connected to receive a particular timing signal in the sequence of timing signals for stepping the sequence counter, said sequence counter having output means providing output signals indicative of various steps thereof, and control logic means connected to said sequence counter output means, to said synchronizing circuit means, and to said data entry circuit means for said selective application of timing signal to said data entry circuit means in a said sequence controlled by said sequence counter.

4. The electronic counter of claim 3 including reset gate means connected to said synchronizing circuit means to receive said particular timing signal, to said sequence counter output means to receive a reset cut-off step signal therefrom, and to the drive input of said sequence counter, said reset gate means operable to selectively pass said particular timing signal to said sequence counter drive input until a said cut-off step of said sequence counter occurs.

5. The electronic counter of claim 4 including count gate means connected to said synchronizing circuit means to receive the timing signals providing the addition instruction, connected to the data entry circuit means, connected to receive the train of electrical indexing signals and operatively connected to said sequence counter output means providing said cut-off step signal, said count gate means operable to selectively block passage of said addition instruction timing signal to said data entry circuit means during stepping of said sequence counter and to pass said addition instruction timing signals to said data entry circuit means upon occurrence of each electrical indexing signal following occurrence of said cut-off step signal thereby to enter an addition instruction.

6. The synchronous counter of claim 4 wherein said reset signal connected to said sequence counter is operable to set said sequence counter to an initial zeroed condition.

7. In an electronic counter having an integrated solid state calculator circuit including synchronizing circuit means repetitively providing a plurality of sequenced timing signals at a plurality of corresponding output conductor means thereof, and having input conductor means for receiving certain of said timing signals selectively coupled thereto for respectively providing separate input control signals to the circuit for clearing a count therein, for conditioning the circuit to count in particular increments, and for advancing the count by the particular increments established, the improvement wherein said counter includes reset means comprising multi-step electronic sequence counter means selectively coupled to a particular said circuit output conductor means for stepping operation responsive to timing signals received therefrom and having output means providing output signals indicative of various steps thereof, said sequence counter means being selectively conditioned for said stepping operation and coupled to said particular output conductor means of said circuit in response to reset signal means selectively applied thereto and being uncoupled from said particular output conductor means upon reaching a predetermined cut-off step of the counter means control logic means coupled to the circuit output conductor means for said certain timing signals and to certain of said sequence counter output means, said control logic means being responsive to said sequence counter output signals and coupled to said circuit input conductor means for transmitting thereto the timing signal providing said count clearing control signal during one output step of said sequence counter and the timing signal providing said conditioning control signal during another output step of said sequence counter subsequent to said one; and count indexing signal logic means receiving count indexing signals and being coupled to said sequence counter output means, to the circuit output conductor means for said certain timing signals and to said circuit input conductor means for selectively connecting the timing signal providing said count advancing control signal to said circuit input conductor means during count indexing input signals occurring after both said one and said another steps of said sequence counter and upon attaining said predetermined cut-off step of said sequence counter.

8. The counter of claim 7 including reset gate means having said timing signals from said particular circuit output terminal coupled as an input thereto and having its output coupled to the input of said sequence counter to provide said selective coupling of timing signals to the sequence counter, a particular said sequence counter output means being coupled to an input of said reset gate means for opening said gate when said sequence counter is conditioned for stepping by reset signal means and for closing said gate when said sequence counter attains a particular count, said particular count comprising the predetermined cut-off step.

9. The counter of claim 7 wherein said sequence counter output means and said control logic means are operable to couple the timing signal providing said count clearing signal to the input conductor means additionally during a second step of said sequence counter intermediate said one step and said another step and during a third step following said anoher step and before said cut-off step.

10. The counter of claim 7 wherein each said input control signal means comprises at least a certain number of consecutive repetitions of said timing signal from a certain circuit output conductor means, and said sequence counter is a compound binary counter having a multi-stage lower order section and a multi-stage higher order section, said lower order section adapted to count said certain number of consecutive repetitions of digit signals and said step output means being associated with said higher order section.

11. The counter of claim 8 wherein said lower order section of the sequence counter is an 8-step counter and said higher order section is a 16-step counter.

12. In an electronic counter having an input circuit for receiving a train of electrical indexing signals for indexing the counter to accumulate a count therein; a display register with a plurality of digit indicators of ascending order of significance for displaying a count, control input means for sequentially activating the digit indicators for sequentially entering digit counts therein respectively, and a binary input for receiving binary coded input signals for entering digit counts into the digit indicators respectively; and a large scale integrated solid state calculator circuit element comprising an arithmetic and control circuit with register means for storing a plurality of separate multiple digit counts therein, including a selected count entered into the register means and an arithmetic count resulting from an arithmetic operation of the arithmetic and control circuit, and a binary output connected to the binary input of the display register and operable, to sequentially provide binary coded output signals indicative of the digit counts of a count stored in the register means for sequentially entering the digit counts into corresponding digit indicators of the display register respectively, for displaying the count with the display register, synchronizing circuit means for repetitively generating a sequence of timing signals, the synchronizing circuit means being connected to the arithmetic and control circuit and to the control input means of the display register for synchronously entering a count stored in the register means into the display register for display thereby, the arithmetic and control circuit having data entry circuit means and operable by selectively applying timing signals to the data entry circuit means for storing a selected count in the register means and displaying the selected count with the display register, the arithmetic and control circuit being further operable by selectively applying timing signals to the data entry circuit means for entering mathematical operation instruction signals into the arithmetic and control circuit for respectively effecting predetermined mathematical operations between the separate counts stored in the register means and storing in the register means the results of the selected mathematical operation as a new arithmetic count and displaying the new arithmetic count with the display register, and including entering an addition instruction signal for adding the selected count stored in the register means to any arithmetic count stored in the register means and storing, in the register means, the summation thereof as a new arithmetic count and displaying the new arithmetic count with the display register, the arithmetic and control circuit being further operable by selectively applying timing signals to the data entry circuit means for selectively clearing any arithmetic count and any selected count stored in the register means and clearing the display register without clearing the selected count stored in the register means, each said selective application of timing signals to the data entry circuit means requiring at least eight consecutive repetitions of a particular said timing signal; the improvement wherein the electronic counter comprises counter reset means having a compound electronic binary sequence counter having a lower order section of at least three stages and a four stage, 16-step higher order section, each of said four higher order stages having a step signal output means for providing a binary step signal corresponding with the sequence step count of said higher order counter section, said sequence counter responsive to a reset signal to attain an initial zeroed condition; a reset gate connected to the synchronizing circuit means to receive a predetermined one of the timing signals in each said sequence thereof, to the signal output means of the fourth stage of said higher order counter section, and to the input of said lower order counter section for passing said predetermined one of the timing signals to said sequence counter for stepping operation thereof when said sequence counter is zeroed for sequence counting and for blocking said predetermined one of the timing signals at the eighth step of said higher order counter section to terminate said stepping operation, reset switch means connected to said sequence counter and selectively operable for generating a reset signal for zeroing said sequence counter, and control logic means connected to said synchronizing circuit means, to the step signal output means for each of the first three stages of said sequence counter higher order section, and to the data entry circuit means and operable to selectively apply timing signals to the data entry circuit means during the first and third steps of said higher order counter section for operating the arithmetic and control circuit to clear any selected and arithmetic counts from the register means and clear the display register, during the fifth step of said higher order section to store a predetermined selected count in the register means, and during the seventh step of said higher order counter section to clear the display register without clearing the selected count from the register; and wherein the counter input circuit comprises count indexing logic means for receiving the train of electrical indexing signals, said count indexing logic means connected to said synchronizing circuit means, to said fourth stage of said higher order counter section and to the data entry circuit means and selectively operable by each indexing signal only during the eighth step of said higher order counter section to selectively apply a timing signal to add to any arithmetic count stored in the register means the predetermined selected count stored in the register means during the reset sequence and store the summation thereof as a new arithmetic count in the register means and display the new arithmetic count with the display register.

* * * * *